(12) United States Patent
Kim et al.

(10) Patent No.: US 8,736,376 B2
(45) Date of Patent: May 27, 2014

(54) POWER AMPLIFIER MODULE HAVING BIAS CIRCUIT

(75) Inventors: Gyu Suck Kim, Seoul (KR); Yoo Sam Na, Seoul (KR)

(73) Assignee: Samsung Electro-Mechanics Co., Ltd., Suwon, Gyeonggi-do (KR)

( * ) Notice: Subject to any disclaimer, the term of this patent is extended or adjusted under 35 U.S.C. 154(b) by 100 days.

(21) Appl. No.: 13/444,491

(22) Filed: Apr. 11, 2012

(65) Prior Publication Data

US 2013/0076447 A1 Mar. 28, 2013

(30) Foreign Application Priority Data

Sep. 23, 2011 (KR) .................. 10-2011-0096167

(51) Int. Cl.
*H03F 3/21* (2006.01)

(52) U.S. Cl.
USPC .......................................... 330/296; 330/285

(58) Field of Classification Search
USPC .................. 330/285, 296, 273, 267
See application file for complete search history.

(56) References Cited

U.S. PATENT DOCUMENTS

| | | | |
|---|---|---|---|
| 4,893,093 A | 1/1990 | Cronauer et al. | |
| 8,378,749 B1 * | 2/2013 | Kim et al. ..................... | 330/261 |
| 2003/0137355 A1 | 7/2003 | Lin | |
| 2004/0227577 A1 | 11/2004 | Noh et al. | |
| 2005/0083128 A1 | 4/2005 | Chan et al. | |
| 2008/0238553 A1 | 10/2008 | Cho et al. | |

FOREIGN PATENT DOCUMENTS

| | | |
|---|---|---|
| KR | 10-2003-0043892 | 6/2003 |
| KR | 10-2006-0069481 | 6/2006 |
| KR | 2008-0088224 A | 10/2008 |
| WO | WO 2005/022740 A2 | 3/2005 |

OTHER PUBLICATIONS

Maxim Semiconductors: "Datasheet LDMOS RF Power-Amplifier Bias Controller DS1870", Feb. 28, 2006.
Maxim Semiconductors: "Application Note 3175: Base-Station RF Power Amplifier Biasing", Apr. 6, 2004.
Extended European Search Report issued in EP Application No. 12275034.2 dated Jan. 28, 2013.
Analog Devices: "Digital Potentiometers". p. 1-10. 2009.
Korean Office Action issued in Korean Patent Application No. 10-2011-0096167, mailed on Dec. 14, 2012, with an English translation.
European Examination Report (Communication pursuant to Article 94(3) EPC) issued in European Application No. 12 275 034.2 dated Oct. 21, 2013.

* cited by examiner

*Primary Examiner* — Hieu Nguyen
(74) *Attorney, Agent, or Firm* — McDermott Will & Emery LLP

(57) ABSTRACT

There is provided a power amplifier module having a bias circuit, in which a bias power is supplied to an amplifier by differently setting an impedance between an input signal terminal and a reference power terminal and an impedance between the input signal terminal and a ground. The power amplifier module includes: an amplifier unit receiving a bias power to amplify an input signal; and a bias unit supplying the bias power to the amplifier, by differently setting an impedance between an input signal terminal transmitting the input signal therethrough and a reference power terminal transmitting a reference power having a predetermined voltage level and an impedance between the input signal terminal and a ground.

3 Claims, 4 Drawing Sheets

POWER AMPLIFIER MODULE HAVING BIAS CIRCUIT

CROSS-REFERENCE TO RELATED APPLICATIONS

This application claims the priority of Korean Patent Application No. 10-2011-0096167 filed on Sep. 23, 2011, in the Korean Intellectual Property Office, the disclosure of which is incorporated herein by reference.

BACKGROUND OF THE INVENTION

1. Field of the Invention

The present invention relates to a power amplifier module having a bias circuit with improved linear characteristics.

2. Description of the Related Art

A hybrid bipolar transistor (HBT)-based power amplifier, most commonly used in the field of RF communications, has been known as an amplifier satisfying both high efficiency and linear characteristics.

In addition, a large portion of RF communications equipment has been integrated by using complementary metal oxide semiconductor (CMOS) process technology and studies into CMOS process-based power amplifiers have been actively ongoing due to low unit costs and the advantages of a multi-chip structure.

However, despite these advantages, CMOS power amplifiers have been difficult to commercialize as compared with HBT-based power amplifiers. This is the result of low insulation voltages, large source grounding lead inductances generated due to the absence of a via process, and a deterioration in the physical performance of a conductive substrate.

To address these physical limitations, there is a need of the provision of a bias circuit capable of actively supplying a bias power to the CMOS power amplifier to improve linear characteristics.

SUMMARY OF THE INVENTION

An aspect of the present invention provides a power amplifier module having a bias circuit, in which a bias power is supplied to an amplifier by differently setting an impedance between an input signal terminal and a reference power terminal and an impedance between the input signal terminal and a ground.

According to an aspect of the present invention, there is provided a power amplifier module having a bias circuit, the power amplifier module including: an amplifier unit receiving a bias power to amplify an input signal; and a bias unit supplying the bias power to the amplifier, by differently setting an impedance between an input signal terminal transmitting the input signal therethrough and a reference power terminal transmitting a reference power having a predetermined voltage level and an impedance between the input signal terminal and a ground.

The bias unit may include: at least one first NMOS transistor connected in series between the input signal terminal and the ground, and having a drain and a gate connected to the input signal terminal and a source connected to the ground together with the gate; and at least one second NMOS transistor connected in series between the input signal terminal and the reference power terminal, and having a drain and a gate connected to the reference power terminal and a source connected to the input signal terminal together with the gate.

The second NMOS transistor may be larger than the first NMOS transistor.

The bias unit may include at least one transistor group having: a first NMOS transistor connected between the input signal terminal and the ground, and having a source and a gate connected to the ground; a second NMOS transistor having a source and a gate connected to a drain and the gate of the first NMOS transistor and a drain connected to the input signal together with the gate; a third NMOS transistor connected between the input signal terminal and the reference power terminal, and having a source and a gate connected to the input signal terminal; and a fourth NMOS transistor having a source and a gate connected to a drain and the gate of the third NMOS transistor and a drain connected to the reference power terminal together with the gate.

The at least one transistor group may include: a first switch connected in parallel to the first NMOS transistor, and turned on according to a control signal to bypass a power to be applied to the first NMOS transistor; and a second switch connected in parallel to the third NMOS transistor, and turned on according to the control signal to bypass a power to be applied to the third NMOS transistor.

The transistor group may include a plurality of transistor groups, and the plurality of transistor groups may be connected in parallel.

The power amplifier module may further include a control unit supplying the control signal to the first and second switches.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Embodiments of the present invention will now be described in detail with reference to the accompanying drawings.

Figure 1:
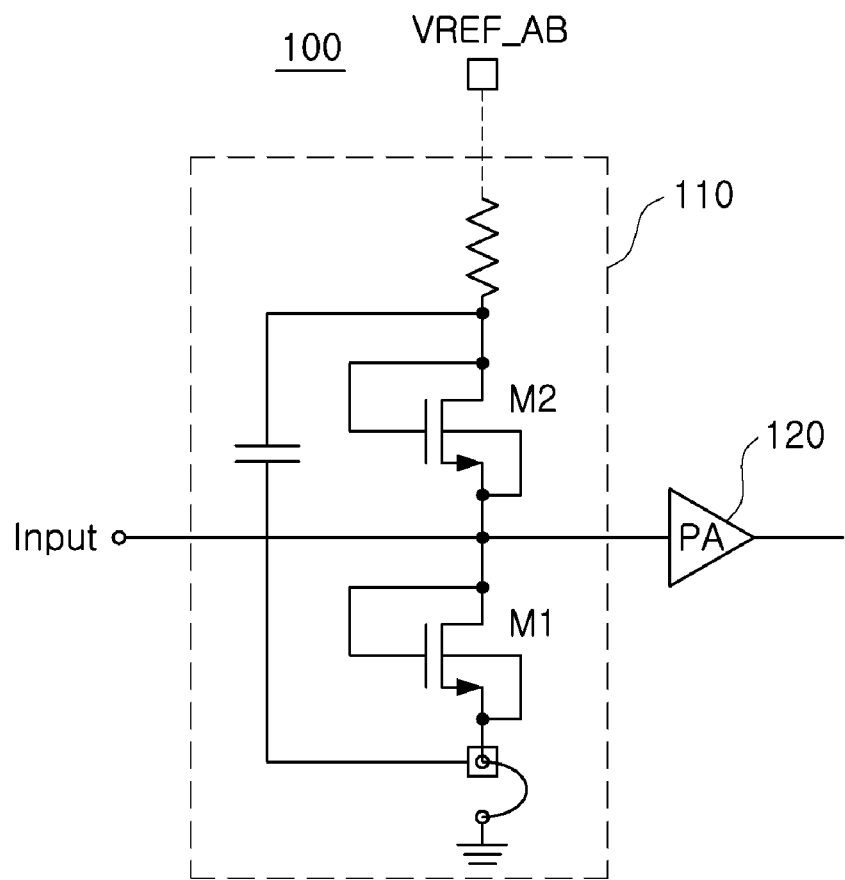
FIG. 1 is a schematic circuit diagram of a power amplifier module according to an embodiment of the present invention.

FIG. 1 is a schematic circuit diagram of a power amplifier module according to an embodiment of the present invention.

Referring to FIG. 1, a power amplifier module 100 according to an embodiment of the present invention may include a bias unit 110 and an amplifier unit 120.

The bias unit 110 supplies a bias power to the amplifier unit 120. The amplifier unit 120 receives the bias power, amplifies an input signal by a predetermined gain, and outputs the amplified signal.

The bias unit 110 may be formed between an input signal terminal to which the input signal is inputted, and the amplifier unit 120.

The bias unit 110 may include first and second N-type metal oxide semiconductor (NMOS) transistors M1 and M2, and the first and second NMOS transistors M1 and M2 may be connected in series between a reference power terminal transmitting a reference power (VREF_AB) therethrough and a ground.

In other words, a drain and a gate of the first NMOS transistor M1 may be connected to the input signal terminal, and a source and the gate of the first NMOS transistor M1 may be connected to the ground. A drain and a gate of the second NMOS transistor M2 may be connected to the reference power terminal, and a source and the gate of the second NMOS transistor M2 may be connected to the input signal terminal. Here, the second NMOS transistor M2 is larger than the first NMOS transistor M1, and thus, an impedance between the input signal terminal and the reference power terminal may be set differently from an impedance between the input signal terminal and the ground.

Figure 2:
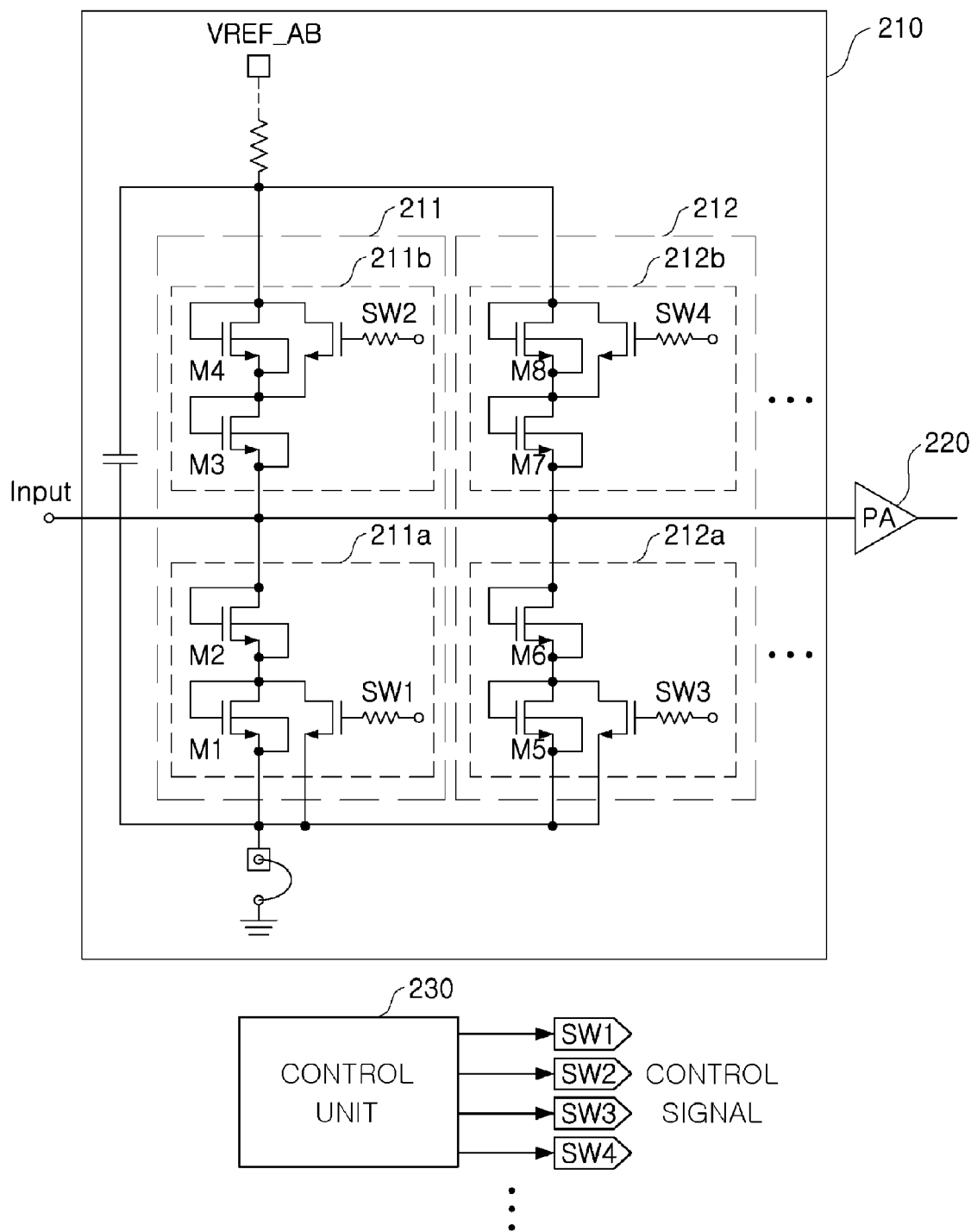
FIG. 2 is a schematic circuit diagram of a power amplifier module according to another embodiment of the present invention.

FIG. 2 is a schematic circuit diagram of a power amplifier module according to another embodiment of the present invention.

Referring to FIG. 2, a power amplifier module 200 according to another embodiment of the present invention may include a bias unit 210 and an amplifier unit 220.

The amplifier unit 220 is the same as the amplifier unit 120 of FIG. 1, and detailed description thereof will be omitted.

The bias unit 210 may include at least one transistor group 211. The transistor group 211 may include first to fourth NMOS transistors M1, M2, M3, and M4.

The first to fourth NMOS transistors M1, M2, M3, and M4 may be connected in series between the reference power terminal and the ground. In other words, the first and second NMOS transistors M1 and M2 of a low side group 211a may be connected in series between the input signal terminal and the ground, and the third and fourth NMOS transistors M3 and M4 of a high side group 211b may be connected in series between the reference power terminal and the input signal terminal.

A drain and a gate of the first NMOS transistor M1 may be connected to a source and a gate of the second NMOS transistor M2, and a source and the gate of the first NMOS transistor M1 may be connected to the ground. A drain and the gate of the second NMOS transistor M2 may be connected to the input signal terminal, and the source and the gate of the second NMOS transistor M2 may be connected to the drain and the gate of the first NMOS transistor M1.

A drain and a gate of the third NMOS transistor M3 may be connected to a source and a gate of the fourth NMOS transistor M4, and a source and the gate of the third NMOS transistor M3 may be connected to the input signal terminal. A drain and the gate of the fourth NMOS transistor M4 may be connected to the reference power terminal, and the source and the gate of the fourth NMOS transistor M4 may be connected to the drain and the gate of the third NMOS transistor M3.

The low side group 211a and the high side group 211b may include a first switch SW1 and a second switch SW2, respectively.

The first switch SW1 may be connected in parallel to the first NMOS transistor M1, and the second switch SW2 may connected in parallel to the third NMOS transistor M3.

The first and second switches SW1 and SW2 may be turned on by a control signal, and thereby to bypass a power to be applied to the first and third NMOS transistors M1 and M3.

A control unit 230 may provide the control signal controlling turn-on and turn-off of the first and second switches SW1 and SW2.

The bias unit 210 in the power amplifier module 200 according to another embodiment of the present invention may include a plurality of transistor groups, for example first and second transistor groups 211 and 212. The second transistor group 212 may include fifth to eighth NMOS transistors M5, M6, M7, M8, and third and fourth switches SW3 and SW4, which form the same configuration as that of the first transistor group 211.

For this reason, the control unit 230 may further provide a control signal controlling turn-on and turn-off of the third and fourth switches SW3 and SW4.

Meanwhile, a two-tone test is generally used in order to check distortion with respect to non-linear characteristics of an RF power amplifier. The input signal is expressed by the following Equation 1:

$$v_{in} = A\{\cos(w_1 t) + \cos(w_2 t)\} \qquad \text{Equation 1}$$

In RF communications, intermodulation distortion (IMD) of an in-band mainly comes from third-order intermodulation distortion (IMD3) components found at frequencies $2\omega_1 - \omega_2$ and $2\omega_2 - \omega_1$ in an output current spectrum by a two-tone test.

A CMOS power amplifier may be a current source that receives voltage to output current and it is controlled by voltage. Here, a transfer function may be expanded as Taylor series, Equation 2 below:

$$i_{DS}(v_{GS}+v_{gs}) = i_{DS}(V_{GS}) + G_1(V_{GS})v_{gs} + G_2(V_{GS})v_{gs}^2 + G_3(V_{GS})v_{gs}^3 + \ldots \qquad \text{Equation 2}$$

Figure 3:
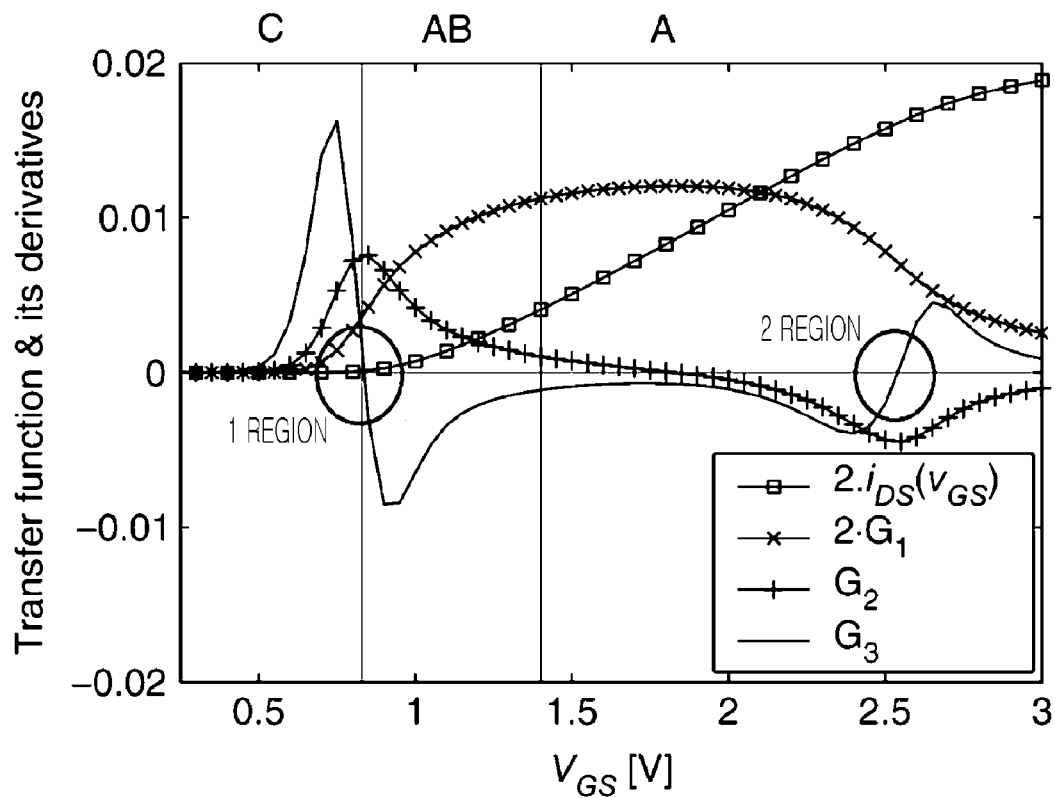
FIG. 3 is a sweet-spot graph of a class AB bias power.

Here, $G_N$ is a coefficient representing the nth-order distortion, and variances in $G_N$ against input voltages ($V_{GS}$) are shown in FIG. 3. An equation directly involved in IMD3, which are frequencies $2\omega_1 - \omega_2$ and $2\omega_2 - \omega_1$, comes from $G_3(V_{GS})v_{gs}^3 + \ldots$, which includes the fourth term and subsequent terms (hereafter, expressed as $i_{DS,3}$ in Equation 2. Higher order terms in Equation 2 are residual terms of Taylor series, and they may be expressed by the following Equation 3:

$$G_3(V_{GS})v_{gs}^3 + \ldots = \frac{1}{2}\int_0^{v_{gs}}(v_{gs}-x)^2 G_3(x+V_{GS})dx \qquad \text{Equation 3}$$

In FIG. 3, in a case in which a bias is trapped in a Class-AB region, when an input signal is increased, a value of $i_{DS,3}$ is initially negative, moves through "zero" while passing through Region 1, and then becomes positive. Here, when the input signal is further increased, the value of $i_{DS,3}$ again moves through "zero" and is then negative, by the addition of negative G3 values on the right to the bias. Here, the point at which the value of $i_{DS,3}$ is "zero" is referred to as a sweet-spot point, in which less IMD3 components are generated. In general, a Class-AB bias has two sweet-spot points.

Figure 4:
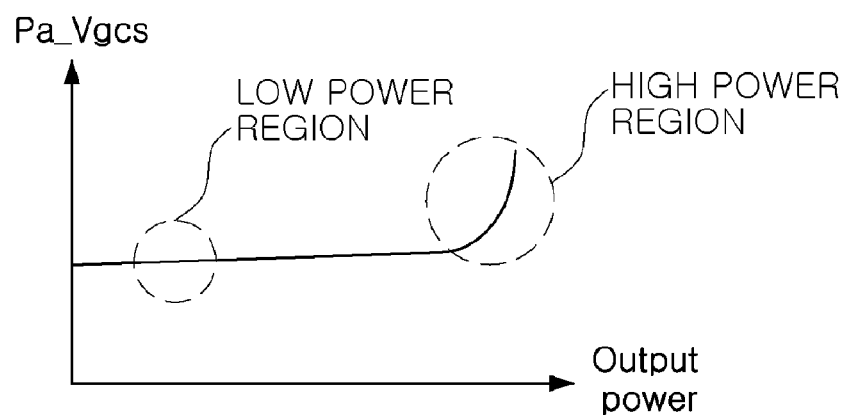
FIG. 4 is a voltage characteristic graph pursued by a power amplifier module according to an embodiment of the present invention.

A basic operating characteristic of an active bias is such that it operates closely to Class B to improve idle current and efficiency characteristics of the amplifier when an input power of the power amplifier is low, and it operates closely to Class A to improve linear characteristics when the input power of the power amplifier is high, as shown in FIG. 4.

Referring to FIG. 1, when voltage swing of the input signal is large, the transistor of the bias unit 110 instantly crosses the line between on and off regions. Here, the amount of current flowing through each device is changed, and thereby to change an average voltage level of a bias power transferred to the amplifier unit 120. Due to this operating characteristic, in a case of a small-signal region in which voltage swing of the input signal is small, a bias power having a constant voltage level is provided to the amplifier unit 120, like in a low-power region of FIG. 4. In a case in which voltage swing of the input signal is large than a turn on voltage of a transistor, when a size of the second NMOS transistor M2 is larger than a size of the first NMOS transistor M1, the average voltage level of the bias power rises, like in a high-power region of FIG. 4.

Here, the point in time at which the average voltage level of the bias power rises and the slope of the bias power are determined according to the size ratio of stacked transistors. In other words, as shown in FIG. 2, a size of the transistor of the high side group is set to be larger than a size of the transistor of the low side group, so that the average voltage level of the bias power rises according to an output power level, as shown in FIG. 4.

Referring to FIG. 2, in a case in which two NMOS transistors are constituted as a stack, like in the high side groups 211b and 212b or the low side groups 211a and 212a, a rising section is moved to a high power region so that the average voltage level of the bias rises according to a higher power of the input signal, and thus, linear characteristics at a higher power level can be improved in this case, as compared with a case in which a single NMOS transistor is used.

Further, the operations of the stacked transistors can be controlled by turning on or turning off the switches according to the control signal, and thereby to control the average voltage level of the bias, which determines linear characteristics of the power amplifier at a high output region, and thus, the power amplifier can be robust against PVT variation and load change conditions.

In the power amplifier module 200 according to the embodiment of the present invention as shown in FIG. 2, the bias unit 210 may be operated at four operating states.

Figure 5:
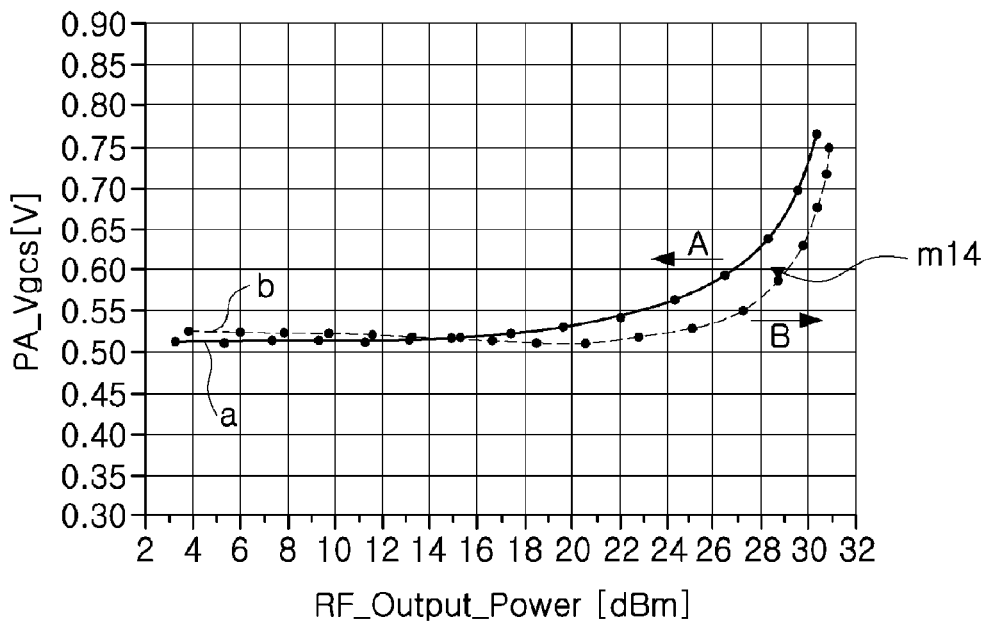
FIG. 5 is a voltage characteristic graph of a power amplifier module according to an embodiment of the present invention.

In operating state 1 (SW1:ON, SW3:ON, SW2:ON, SW4: ON), the power amplifier module is operated, like the basic structure as shown in FIG. 1. In operating state 2 (SW1:ON, SW3:ON, SW2:OFF, SW4:ON), the power amplifier is operated, like in Region B of FIG. 5, since the third and fourth NMOS transistors M3 and M4 are constituted as a stack.

In operating state 3 (SW1:ON SW3:ON SW2:ON SW4: OFF), the transistors in a reference power direction are disposed in parallel, with the result that a turn on voltage is lowered, and thus, the average voltage of the bias power rises at lower voltage swing, as shown in Region A of FIG. 5.

In operating state 4 (SW1:ON, SW3:OFF, SW2:ON, SW4: ON), the average voltage of the bias power falls in the high power region in a direction contrary to an X axis in the graph of FIG. 5.

Considering static current consumed by the entirety of the power amplifiers at a section where an input power is low, as shown in FIG. 4, the reference power (VREF_AB) is set to have a proper DC value corresponding thereto.

Figure 6:
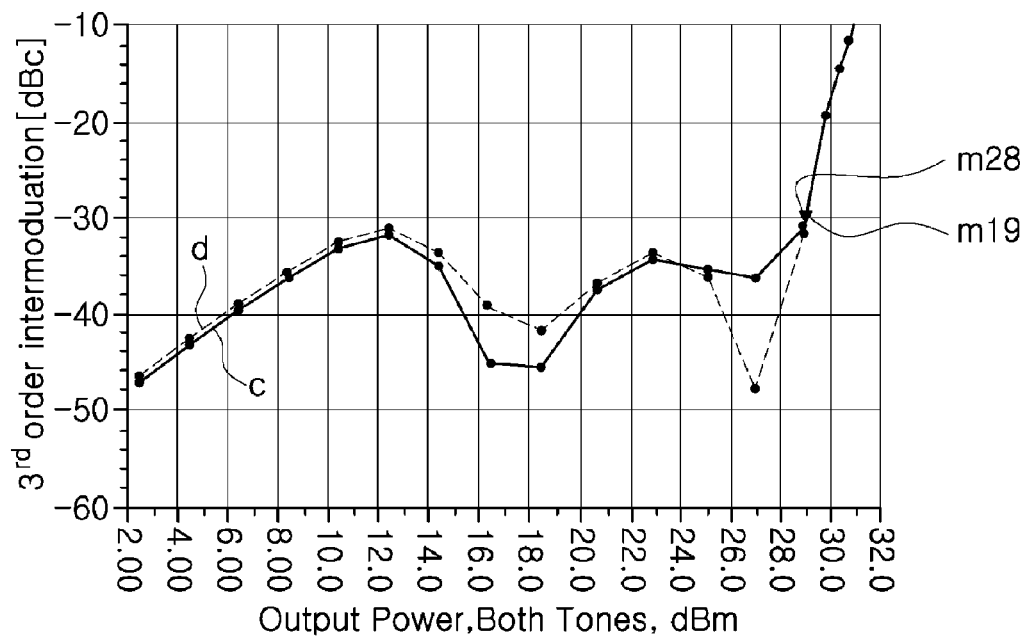
FIG. 6 is a linear characteristic graph of a power amplifier module according to an embodiment of the present invention.

FIG. 6 is a linear characteristic graph of a power amplifier module according to an embodiment of the present invention.

FIG. 6 shows that voltage characteristics according to the output power level in the power amplifier modules according to the embodiments of the present invention proposed in FIGS. 1 and 2 are compared with each other. An open type active bias stack structure (Blue line) is constituted such that an average voltage rises at a region in which an input power level is high as compared with a basic structure (Red line), and thus, linear characteristics at a high output region, which remain problematic in a CMOS power amplifier, can be secured.

FIG. 6 is a graph showing linear characteristics according to the output power level of the proposed open type active bias. It shows a two-tone simulation result for confirming linear characteristics at the output power level according to the power level inputted to the power amplifier. A section in which the average voltage rises was moved to the high power region, thereby improving linear characteristics at a higher power level. Correspondingly to the sweet spot points occurring at Regions 1 and 2 in FIG. 3, sweet spot points, in which IMD3 components are less, were generated at points at which the power levels of the output signal are 18 dBm and 27 dBm in FIG. 6. Therefore, it could be seen that the linear characteristics of the CMOS power amplifier is improved.

As described above, according to the embodiments of the present invention, a diode-connected open type active bias is used in a gate input part of the power amplifier, instead of an active bias structure forming the existing feedback loop used in order to improve linear characteristics, which is problematic in a CMOS power amplifier, and thus, circuit complexity can be reduced and the area thereof can be minimized, while linear characteristics in a high-output region and stability can be improved by minimizing phase variations between input and output signals.

Further, a size ratio of the open type active bias transistors can be controlled, with the result that an average voltage of the bias can be controlled, and thus the amplifier can be robust against PVT variation and load variation conditions.

According to the embodiments of the present invention, a bias power is supplied to an amplifier by differently setting an impedance between an input signal terminal and a reference power terminal and an impedance between the input signal terminal and a ground. Thus, a bias power having DC current of a constant voltage level is supplied to the amplifier in a small signal region in which RF signal swing is small, while a bias power whose voltage level is increased according to a power level of an output signal is supplied to the amplifier in a large signal region in which RF signal swing is large, whereby linear characteristics can be improved.

While the present invention has been shown and described in connection with the exemplary embodiments, it will be apparent to those skilled in the art that modifications and variations can be made without departing from the spirit and scope of the invention as defined by the appended claims.

What is claimed is:

1. A power amplifier module having a bias circuit, the power amplifier module comprising:
   an amplifier unit receiving a bias power to amplify an input signal; and
   a bias unit supplying the bias power to the amplifier
   wherein the bias unit includes at least one transistor group having:
      a first NMOS transistor connected between the input signal terminal and the ground, and having a source and a gate connected to the ground;
      a second NMOS transistor having a source and a gate connected to a drain and the gate of the first NMOS transistor and a drain connected to the input signal terminal together with the gate;
      a third NMOS transistor connected between the input signal terminal and the reference power terminal, and having a source and a gate connected to the input signal terminal;
      a fourth NMOS transistor having a source and a gate connected to a drain and the gate of the third NMOS transistor and a drain connected to the reference power terminal together with the gate;
      a first switch connected in parallel to the first NMOS transistor, and turned on according to a control signal to bypass a power to be applied to the first NMOS transistor; and
      a second switch connected in parallel to the third NMOS transistor, and turned on according to the control signal to bypass a power to be applied to the third NMOS transistor.

2. The power amplifier module of claim 1, wherein the transistor group comprises a plurality of transistor groups, and
   the plurality of transistor groups are connected in parallel.

3. The power amplifier module of claim 1, further comprising a control unit supplying the control signal to the first and second switches.

* * * * *